(12) United States Patent
Shih

(10) Patent No.: US 8,084,791 B2
(45) Date of Patent: Dec. 27, 2011

(54) NON-VOLATILE MEMORY DEVICE INCLUDING NITROGEN POCKET IMPLANTS AND METHODS FOR MAKING THE SAME

(75) Inventor: Yen-Hao Shih, Banqiao (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 12/619,075

(22) Filed: Nov. 16, 2009

(65) Prior Publication Data

US 2010/0096689 A1   Apr. 22, 2010

Related U.S. Application Data

(62) Division of application No. 11/381,307, filed on May 2, 2006, now Pat. No. 7,638,393.

(51) Int. Cl.
*H01L 27/148* (2006.01)
(52) U.S. Cl. ........ 257/239; 257/321; 257/322; 257/550; 257/E29.309
(58) Field of Classification Search ............... 257/239, 257/321, 322, 549, 550, E29.309
See application file for complete search history.

(56) References Cited

U.S. PATENT DOCUMENTS

| 6,362,051 B1 | 3/2002 | Yang et al. |
| 6,399,984 B1 * | 6/2002 | Wu et al. ............... 257/316 |
| 6,482,706 B1 * | 11/2002 | Yeh et al. ............... 438/301 |
| 6,537,881 B1 | 3/2003 | Rangarajan et al. |
| 7,026,217 B1 | 4/2006 | Kamath et al. |
| 2003/0230784 A1 * | 12/2003 | Iwata et al. ............... 257/401 |
| 2005/0087778 A1 * | 4/2005 | Gamo et al. ............... 257/288 |
| 2005/0238922 A1 | 10/2005 | Konoshita et al. |

OTHER PUBLICATIONS

Cheung, et al., Plasma Damage Immunity of Thin Gate Oxide Grown on Very Lightly N+ Implated Silicon, IEEE Electron Device Letters, vol. 19, No. 7, Jul. 1998, pp. 231-233.
Shimizu, et al., 0.15um CMOS Process for High Performance and High Reliability, IEEE Electron Device Letters, 1994, 7 pages.

* cited by examiner

*Primary Examiner* — Michael Trinh
(74) *Attorney, Agent, or Firm* — Baker & McKenzie LLP

(57) ABSTRACT

In a non-volatile memory structure, the source/drain regions are surrounded by a nitrogen-doped region. As a result, an interface between the substrate and the charge trapping layer above the nitrogen-doped region is passivated by a plurality of nitrogen atoms. The nitrogen atoms can improve data retention, and performance of cycled non-volatile memory devices.

10 Claims, 6 Drawing Sheets

NON-VOLATILE MEMORY DEVICE INCLUDING NITROGEN POCKET IMPLANTS AND METHODS FOR MAKING THE SAME

RELATED APPLICATION

This application is a Divisional Application of U.S. patent application Ser. No. 11/381,307, entitled "Non-volatile Memory Device Including Nitrogen Pocket Implants and Methods for Making the Same" filed May 2, 2006, which has issued as U.S. Pat. No. 7,638,393, and which is herein incorporated by reference in its entirety for all purposes.

BACKGROUND

1. Field of the Invention

The embodiments described below are related to non-volatile memory devices, and more particularly to systems and methods for improving the reliability of non-volatile memory devices.

2. Background of the Invention

Conventional non-volatile memory devices rely on floating gate technology, or a trapping layer construction to store charge that can then be read out of the device. Such non-volatile memory devices can be viewed as enhancements to the standard metal oxide semiconductor (MOS) transistor. As is well understood, a MOS transistor comprises three main terminals: a source, a drain, and a gate. A potential applied to the gate directly controls the formation and conductivity of a channel formed below the gate between the source and drain. The conductivity of the channel affects the flow of current between the source and drain terminals. The channel becomes significantly conductive as the gate potential exceeds a certain threshold, referred to as the transistor's threshold voltage.

A floating gate memory cell differs from a standard MOS transistor in that it has an additional electrically isolated gate, a floating gate, below the standard control gate and above the transistor channel. Such a floating gate is typically composed of a conducting material, such as a polysilicon layer. A floating gate memory device stores information by holding electric charge within a floating gate. Adding or removing charge from the floating gate changes the threshold voltage of the cell, thereby defining whether the memory cell is in a programmed or erase state. Charge flowing in the channel can then be attracted to, or injected into the floating gate or trapping layer.

Charge trapping structures, such as nitride read-only memory structures, on the other hand, include a trapping nitride layer configure to store the charge instead of a floating gate suspended above the cell. FIG. 1 is a diagram illustrating a conventional nitride read-only memory structure 100. As can be seen, nitride read-only memory 100 is constructed on a silicon substrate 102. The silicon substrate can be a P-type silicon substrate or an N-type silicon substrate; however, for various design reasons P-type silicon substrates are often preferred. Drain/source regions 104 and 106 can then be implanted in substrate 102. A trapping structure 108 is then configured on substrate 102 between source/drain regions 104 and 106. Control gate 110 is then formed on top of trapping layer 108.

Drain/source regions 104 and 106 are silicon regions that are doped to be the opposite type as that as substrate 102. For example, where a P-type silicon substrate 102 is used, N-type drain/source regions 104 and 106 can be implanted therein.

Charge trapping structure 108 comprises a nitride trapping layer as well as an isolating oxide layer between the trapping layer and the channel in substrate 102. In other embodiments, trapping structure 108 can comprise a nitride trapping layer sandwiched between two isolating, or dielectric layers, such as oxide layers. Such a configuration is often referred to as an Oxide-Nitride-Oxide (ONO) trapping layer.

Charge can be accumulated and confined within trapping structure 108 next to drain/source regions 104 and 106, effectively storing two separate and independent charges. Each charge can be maintained in one of two states, either programmed or erased, represented by the presence or absence of a pocket of trapped electrons. This enables the storage of two bits of information without the complexities associated with multilevel cell technology.

Each storage area in nitride read-only memory cell 100 can be programmed independently of the other storage area. A nitride read-only memory cell is programmed by applying a voltage that causes negatively charged electrons to be injected into the nitride layer of trapping structure 108 near one end of the cell. Erasing is accomplished by applying voltages that cause holes to be injected into the nitride layer where they can compensate for electrons previously stored in the nitride layer during programming.

In general, because the stored charge is confined next to the drain/source regions within the trapping layer, numerous program-recycles can be performed without significantly degrading the cell's performance. Unfortunately, the interface trap density ($D_{it}$) increases as nitride read-only memory device 100 is cycled. The cycles induce interface traps, i.e., traps at the interface between charge trapping structure 108 and substrate 102. These interface traps will then trap charge at the interface between trapping structure 108 and substrate 102. The interface trap density ($D_{it}$) is a measure of the amount of trapped charge per $cm^2$.

The cycling-induced interface traps will cause swings in the I-V curve for nitride read-only memory device 100 as well as threshold voltage shifts. The I-V swings and threshold voltage shifts can degrade the performance of nitride read-only memory device 100.

For example, the interface traps can cause nitride read-only memory device 100 to pass a program verify operation with much fewer electrons trapped in charge trapping structure 108 than it would typically take for a newer device to pass a program verify operation. Further, high temperature baking anneals the traps, leading to further threshold voltage loss. Thus, cycled nitride read-only memory devices cannot retain their data well in a high temperature environment.

Similar cycle induced interface traps can occur in other non-volatile memory devices, such as the floating gate devices described above. As a result, the performance of non-volatile memory devices can be improved by reducing the interface trap density.

SUMMARY

In a non-volatile memory structure, the source/drain regions are surrounded by a nitrogen-doped region. As a result, an interface between the substrate and the charge trapping structure above the nitrogen-doped region is passivated by a plurality of nitrogen atoms. The nitrogen atoms can improve data retention, and performance of cycled non-volatile memory devices.

In one aspect, the nitrogen-doped regions are implanted around, or adjacent to the source/drain regions and in the path of carrier movement during program and erase cycles.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

The embodiments described below are directed to nitride read-only memory devices; however, it will be apparent that the methods described herein are not limited to nitride read-only memory devices and can apply generally to non-volatile memory devices, e.g., including floating gate flash memory devices, Nbit devices, BE-SONOS devices, PHINES devices, BP-PHINES devices, as well as logic transistors.

In the embodiments described below the source/drain regions are surrounded by a nitrogen-doped region. The interface between the silicon substrate and the trapping structure is then passivated by a plurality of nitrogen atoms. For example, the trapping structure can actually comprise a dielectric layer and a nitrogen-trapping layer. The dielectric layer, i.e., a tunnel oxide, can reside between the trapping layer and the silicon substrate. Thus, the interface between the silicon substrate and the tunnel oxide layer can be passivated by a plurality of nitrogen atoms.

Nitride read-only memory devices store charge in a trapping layer near the source/drain junctions. Accordingly, enhancement of the interface between the silicon substrate and the insulating layer separating the silicon substrate from the charge trapping layer near the source/drain junctions can improve nitride read-only memory reliability. Nitrogen implantation, i.e., implantation of $N_2/N$, followed by annealing can cause interface traps to be passivated by nitrogen atoms. This passivation can strengthen the oxide-substrate interface and reduce damage resulting from hot carrier stress.

Figure 1:
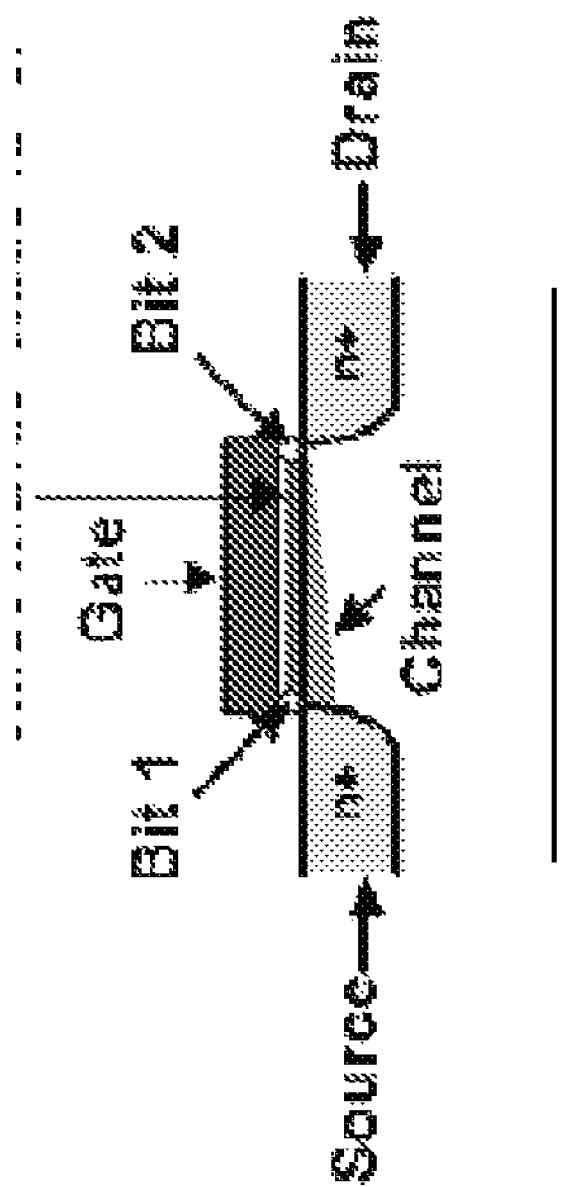
FIG. 1 is a diagram illustrating an exemplary nitride read-only memory device.
Figure 2:
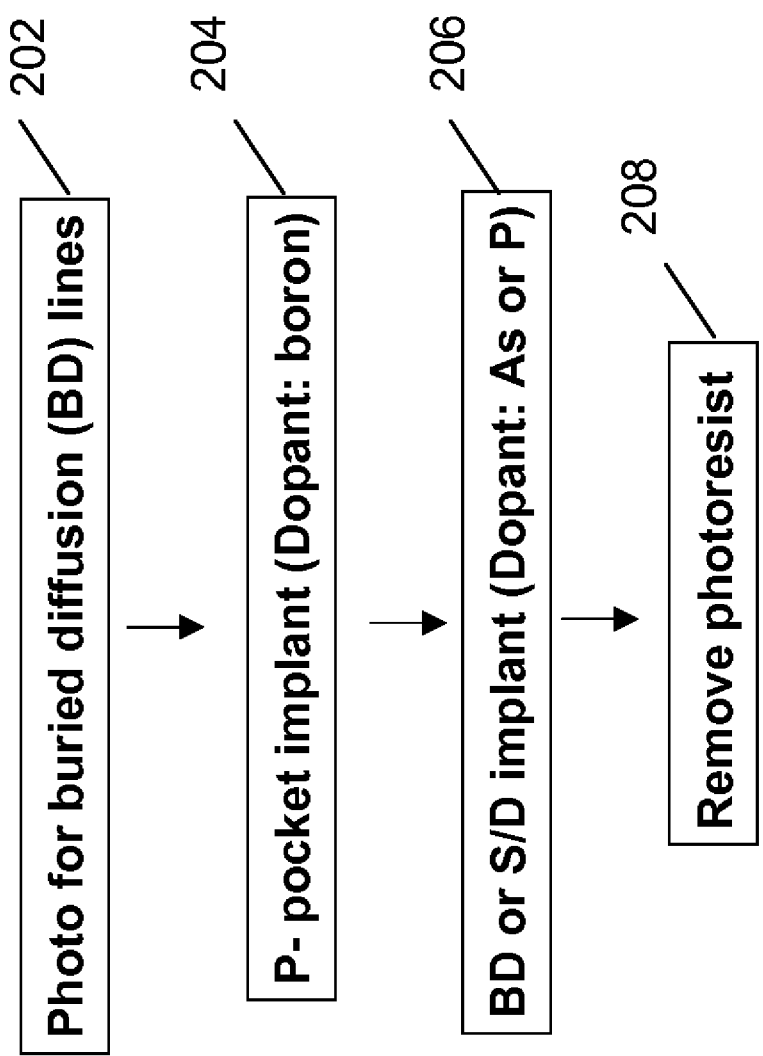
FIG. 2 is a diagram illustrating an exemplary process for implanting source/drain regions within the nitride read-only memory device of FIG. 1.

In the embodiments described below, a nitrogen passivation is achieved by forming a nitrogen pocket implant before forming the buried diffusion lines. FIG. 2 is flowchart illustrating an exemplary process for forming the buried diffusion lines in a nitride read-only memory device. First, in step 202, a photoresist will be formed on the substrate for forming the buried diffusion lines. Next, in step 204, a P-pocket will be implanted in the areas surrounding the buried diffusion lines, e.g., using a dopent such as boron. In step 206, the buried diffusion lines will be implanted e.g., using a dopent such as As or P. In step 208, the photoresist is removed.

Figure 3:
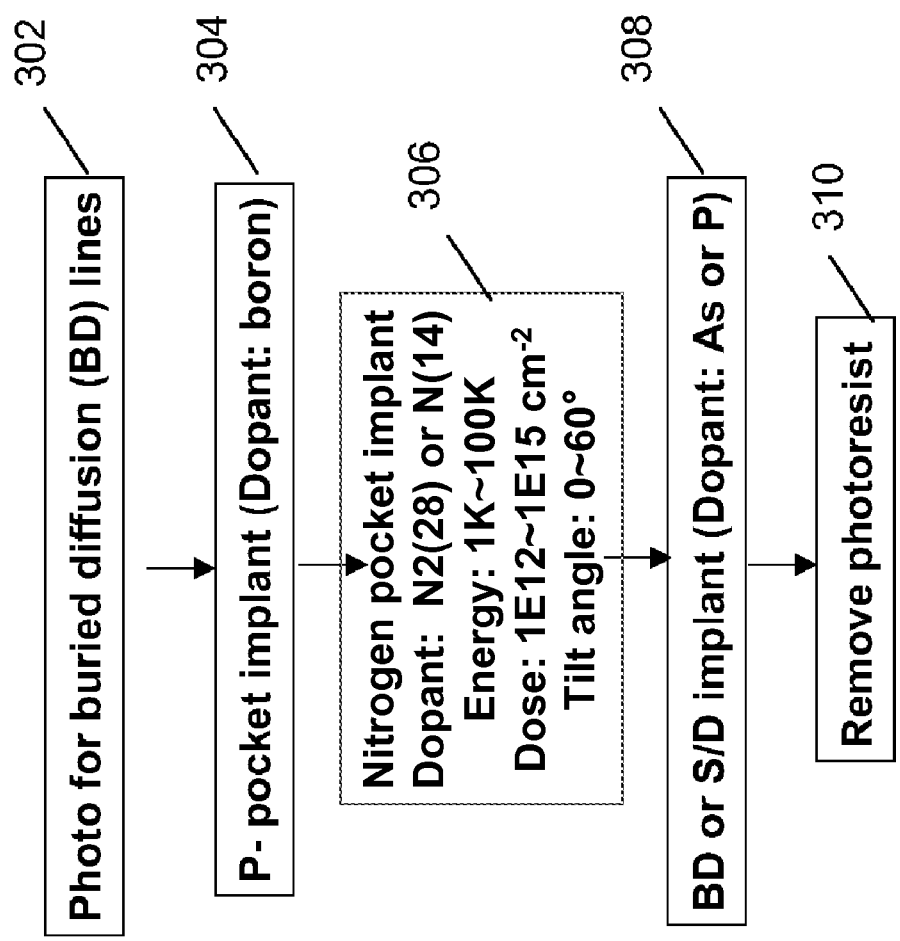
FIG. 3 is a diagram illustrating an example method for implanting source/drain regions in nitride read-only memory device of FIG. 1 in accordance with one embodiment.

In the process according to the embodiments described herein, a nitrogen pocket is implanted within the P-pocket and around the area comprising the buried diffusion lines. FIG. 3 is a diagram illustrating an example method for forming an nitride read-only memory device in accordance with one embodiment. The method of FIG. 3 can be used, for example, to form nitride read-only memory device 400 in FIG. 4. Thus, in step 302, a photoresist can be applied for forming buried diffusion lines 406 and 412. Impurities, in this case P-type impurities, can then be implanted to form pockets 402 and 408, in step 304, using a dopant such as boron.

Figure 4:
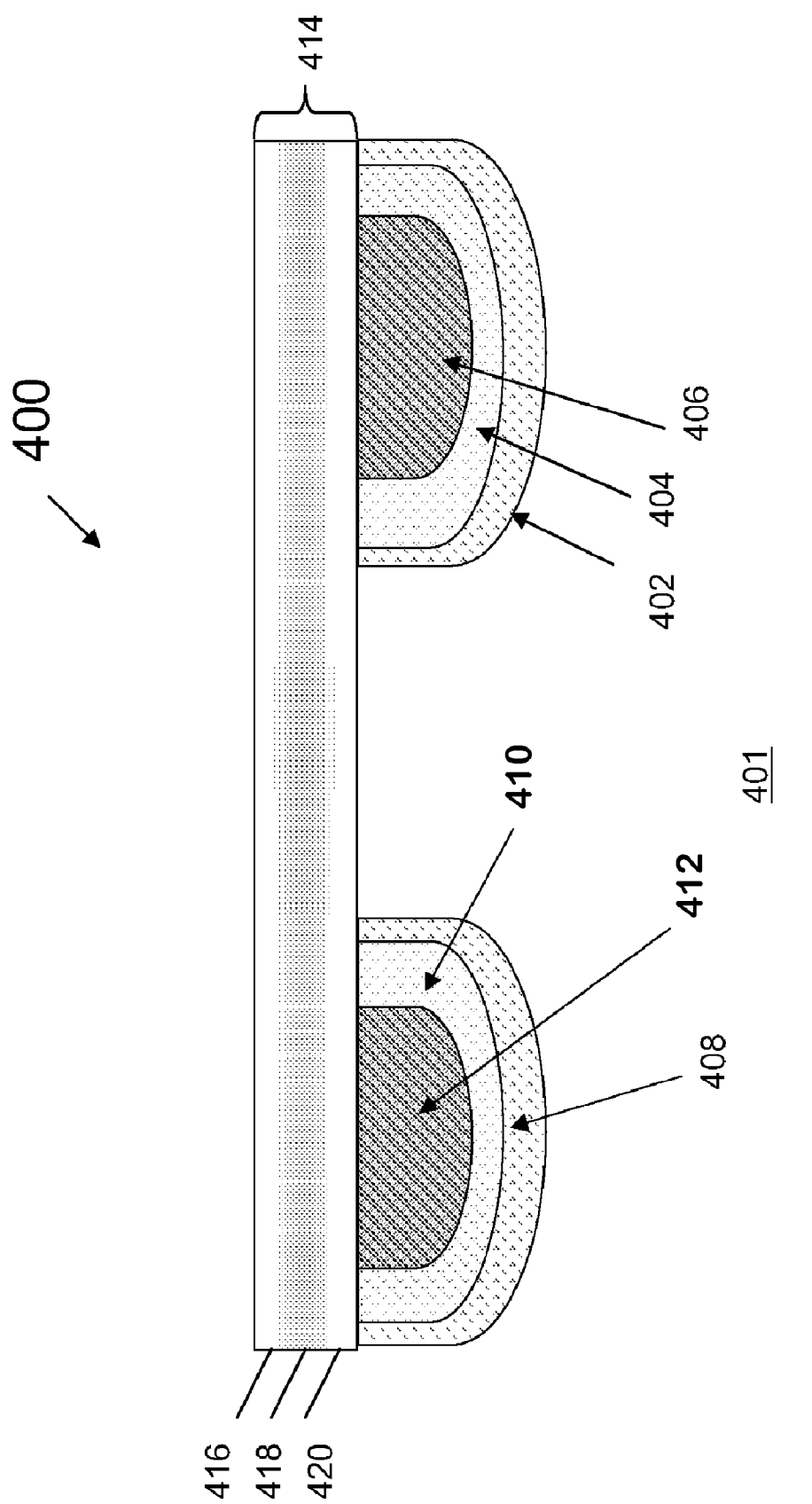
FIG. 4 is a diagram illustrating an example of non-volatile memory structure formed using the process of FIG. 3.

In step 306, nitrogen pocket implants 404 and 410 can then be implanted around the area where buried diffusion lines 406 and 412 will be formed. For example, nitrogen pockets 404 and 410 can be implanted using a dopant such as $N_2(28)$ or $N(14)$, with an energy in the range if about 1 KeV to about 100 KeV, a dose in a range of approximately 1E12 to 1E15 cm$^{-2}$, and a tilt angle of approximately 0° to 60°. In other embodiments, nitrogen implants can be formed near buried diffusion lines 406 and 412, but not necessarily around them as illustrated in FIG. 4.

In step 308, buried diffusion lines 406 and 412 can be implanted, e.g., using a dopent such as As or P. In step 310 the photoresist applied in step 302 can be removed.

After formation of the buried diffusion regions 406 and 412, trapping structure 414 can be formed over substrate 401. In the embodiment of FIG. 4, trapping structure 414 comprises an ONO structure. The ONO structure comprises a dielectric layer, or barrier oxide 420, a nitrogen-trapping layer 418, and another dielectric, or oxide layer 416.

As can be seen, nitrogen implants 404 and 410 contact oxide layer 420. As a result, nitrogen implants 404 and 410 can be used to passivate the interface between silicon substrate 401 and oxide layer 420 with nitrogen atoms. For example, after implantation of nitrogen implants 404 and 410, in step 306, the thermal budget in the sequential fabrication process can be configured so as to allow nitrogen atoms to pile up at the interface between oxide layer 420 and silicon substrate 401. This leads to the nitrogen atom passivation.

Figure 5:
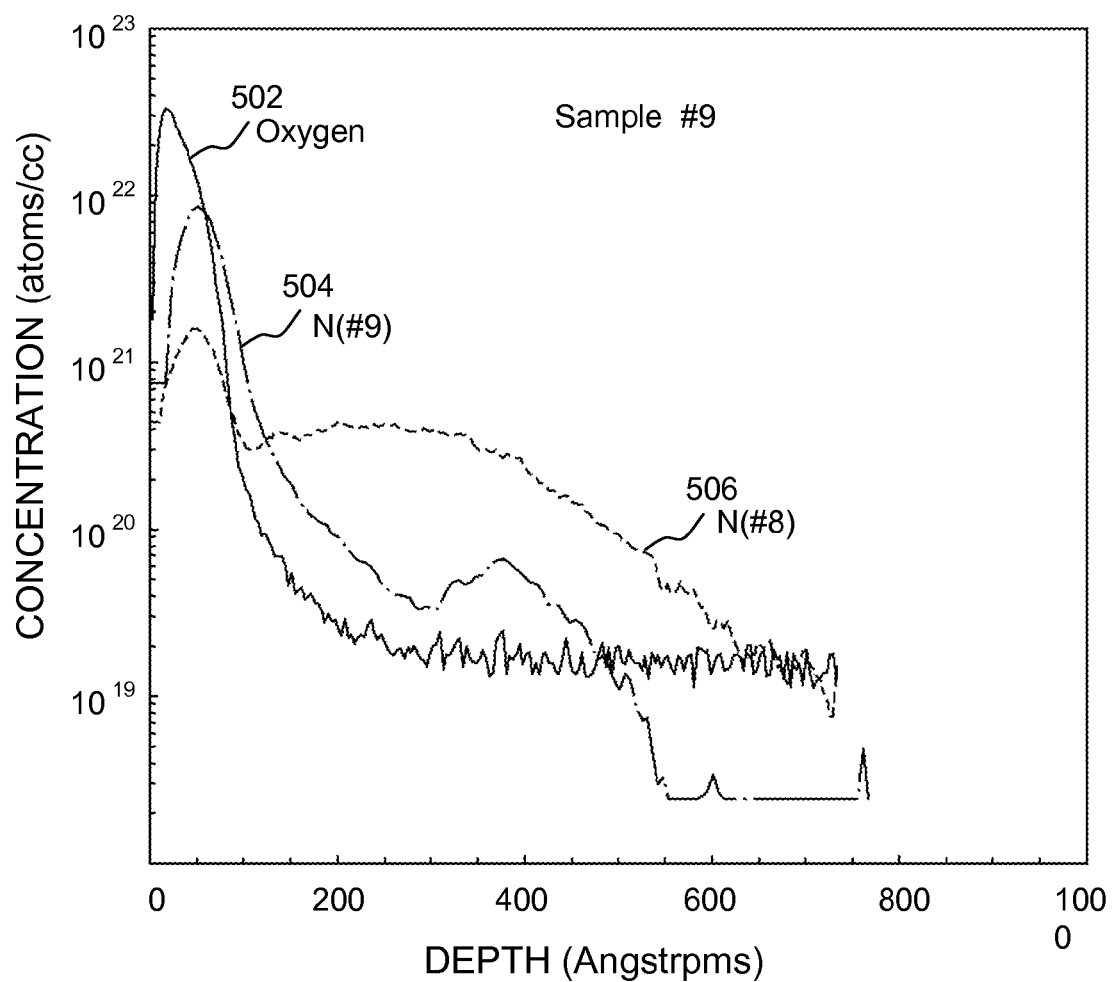
FIG. 5 is a diagram illustrating the concentration of atoms within the device of FIG. 4.

FIG. 5 is a diagram illustrating the concentration of various atoms within silicon substrate 401. Curve 506 illustrates the concentration of nitrogen atoms after implantation of nitrogen implants 404 and 410. Curve 504 illustrates that the amount of nitrogen atoms near the interface of the oxide layer 420 and silicon substrate 401 increases after receiving thermal treatment in the sequential process.

With the nitrogen passivation, nitride read-only memory device 400 will illustrate a smaller $I_{CP}$, which is representative of a stronger interface between oxide layer 420 and silicon substrate 401, e.g., and interface with fewer dangling silicon bonds at the interface between oxide layer 420 and silicon substrate 401.

Figure 6:
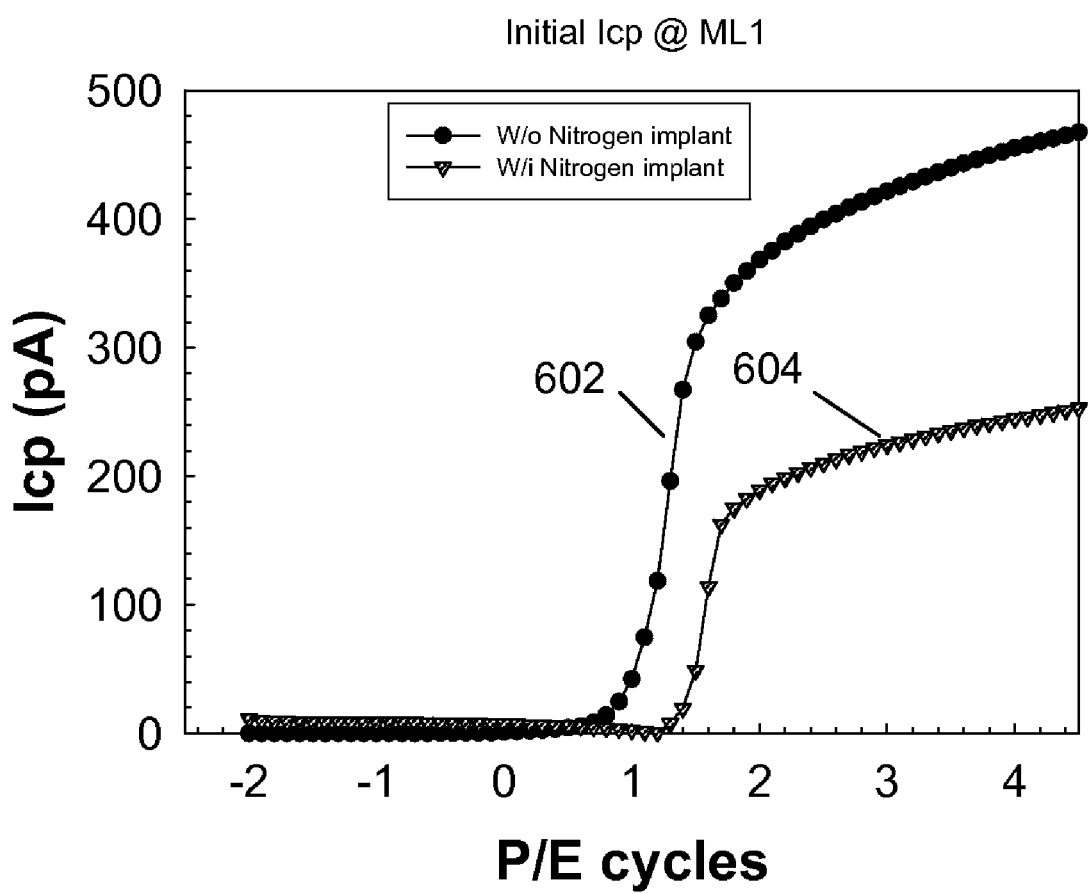
FIG. 6 is a diagram illustrating charge pump current ($I_{CP}$) curves for non-volatile memory devices formed using the method of FIG. 2 versus the method of FIG. 3.

FIG. 6 is a graph illustrating charge pump current ($I_{CP}$) curves 602 and 604 for an nitride read-only memory device without nitrogen implants 404 and 410, and with nitrogen implants for 404 and 410 respectively. The graph of FIG. 6 illustrates the $I_{CP}$ for the devices with initial interface traps. As can be seen, the nitride read-only memory device with nitrogen implants 404 and 410 has a lower $I_{CP}$, representing a better interface.

Accordingly, by including nitrogen implants, e.g., nitrogen implants 404 and 410, near the buried diffusion lines, or source/drain regions, the reliability of an nitride read-only memory device, such as nitride read-only memory device 400, can be improved by the elimination of charged traps at the interface between oxide layer 420 and silicon substrate 401.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A non-volatile memory device, comprising:
   a silicon substrate;
   a diffusion area implanted in the silicon substrate;
   an impurity region formed in the substrate around the diffusion area
   a nitrogen implant surrounding the diffusion area and implanted within the impurity region, wherein the nitrogen implant separates the diffusion area from the silicon substrate; and
   a charge trapping structure formed on the silicon substrate over at least a portion of the diffusion area and in contact with the nitrogen implant.

2. The non-volatile memory device of claim 1, wherein the impurity region is a P-type impurity region.

3. The non-volatile memory device of claim 1, wherein the trapping structure comprises a dielectric layer formed on the silicon substrate and a nitrogen charge trapping layer formed over the dielectric layer.

4. The non-volatile memory device of claim 3, wherein the trapping structure further comprises a dielectric layer formed on top of the nitrogen charge trapping layer.

5. The non-volatile memory device of claim 1, wherein the trapping structure comprises an ONO structure.

6. The non-volatile memory device of claim 1, wherein the diffusion area is completely contained within the nitrogen implant and the nitrogen implant is completely contained within the impurity region.

7. A semiconductor device, comprising:
   an n-type doped region in a substrate;
   a p-type doped region in the substrate;
   a nitrogen doped region formed between the n-type doped and p-type doped regions and surrounding the n-type doped region, wherein the nitrogen doped region separates the n-type doped region from the substrate; and
   a charge trapping structure formed on the substrate in contact with the nitrogen doped region.

8. The non-volatile memory device of claim 7, wherein the trapping structure comprises a dielectric layer formed on the silicon substrate and a nitrogen charge trapping layer formed over the dielectric layer.

9. The non-volatile memory device of claim 8, wherein the trapping structure further comprises a dielectric layer formed on top of the nitrogen charge trapping layer.

10. The non-volatile memory device of claim 7, wherein the trapping structure comprises an ONO structure.

* * * * *